(12) United States Patent
Li et al.

(10) Patent No.: US 10,386,390 B2
(45) Date of Patent: Aug. 20, 2019

(54) VOLTMETER AND METHOD FOR USING THE VOLTMETER

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Tai-Chun Li, Shenzhen (CN); Tsung-Jen Chuang, Tu-Cheng (TW); Hai-Wen Wang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 192 days.

(21) Appl. No.: 15/683,708

(22) Filed: Aug. 22, 2017

(65) Prior Publication Data

US 2019/0041431 A1 Feb. 7, 2019

(30) Foreign Application Priority Data

Aug. 5, 2017 (CN) .......................... 2017 1 0663264

(51) Int. Cl.
*G01R 15/12* (2006.01)
*G01R 19/00* (2006.01)

(52) U.S. Cl.
CPC ......... *G01R 15/12* (2013.01); *G01R 19/0084* (2013.01)

(58) Field of Classification Search
CPC ....... G01R 15/12; G01R 15/125; G01R 19/00
See application file for complete search history.

(56) References Cited

U.S. PATENT DOCUMENTS

| | | | | |
|---|---|---|---|---|
| 4,335,349 A | * | 6/1982 | Baldock | G01R 35/005 324/601 |
| 4,829,239 A | * | 5/1989 | Holstein | G01R 1/22 324/111 |
| 5,396,168 A | * | 3/1995 | Heep | G01R 15/125 324/115 |
| 7,991,568 B2 | * | 8/2011 | Zang | G01R 15/125 702/64 |

\* cited by examiner

*Primary Examiner* — Walter L Lindsay, Jr.
*Assistant Examiner* — Milton Gonzalez
(74) *Attorney, Agent, or Firm* — ScienBiziP, P.C.

(57) ABSTRACT

A voltmeter of the present disclosure includes a multimeter, a first option switch, a second option switch, a control module, an adjusting power source and a button. The multimeter has a positive probe and a negative probe. The first option switch has two binding posts S1, S2, and a connection pin T1. The second option switch also has two binding posts S3, S4 and a connection pin T2. The positive probe of the multimeter is coupled with the connection pin T1 of the first option switch, the negative probe of the multimeter is coupled with the connection pin T2 of the second option switch. The control module can control the first option switch and the second option switch, and read a value of the multimeter, the multimeter and test a voltage of a circuit by the adjusting power source being equivalent to the voltage of the circuit.

11 Claims, 2 Drawing Sheets

VOLTMETER AND METHOD FOR USING THE VOLTMETER

CROSS-REFERENCE TO RELATED APPLICATIONS

This application claims priority to Chinese Patent Application No. 201710663264.9 filed on Aug. 5, 2017, the contents of which are incorporated by reference herein.

FIELD

The subject matter herein generally relates to a voltmeter and method for using the voltmeter.

BACKGROUND

A voltmeter is used to measure voltage of electronic components in the circuit.

Generally, while measuring a voltage on both ends of an electronic component, the voltmeter is connected parallelly on both ends of the electronic component. Because, the voltmeter has a particularly large resistance or is infinite. Thus, a current through the voltmeter is close to zero, and the voltmeter do not split an original current through the electronic component.

However, in fact, the resistance of the voltmeter is not infinite, and the voltmeter splits the current through the electronic component. Thus, while measuring a voltage on both ends of the electronic component by the voltmeter, an actual current value of the electronic component is less than a theory current value of the electronic component. So measuring the actual voltage value of the electronic component is also less than the theory current value of the electronic component.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
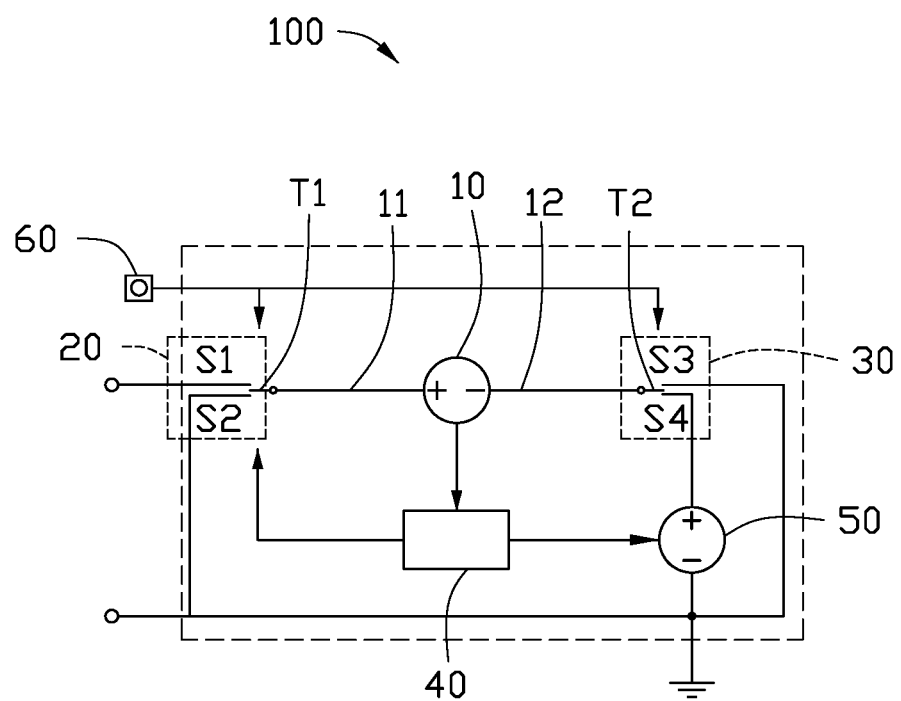
FIG. 1 is a schematic diagram of a voltmeter of the present disclosure.

Referring to FIG. 1, a voltmeter 100 of the present disclosure includes a multimeter 10, a first option switch 20, a second option switch 30, a control module 40, an adjusting power source 50 and a button 60.

The multimeter 10 is a multifunction meter that can measure current value, voltage value and resistance value etc of components. The multimeter 10 has a positive probe 11 and a negative probe 12. The positive probe 11 is coupled with the first option switch 20. The negative probe 12 is coupled with the second option switch 30.

The first option switch 20 has two binding post S1, S2 and a connection pin T1. The second option switch has two binding post S3, S4 and a connection pin T2. The positive probe 11 of the multimeter 10 is coupled with the connection pin T1 of the first option switch 20. The negative probe 12 of the multimeter 10 is coupled with the connection pin T2 of the second option switch 30.

The control module 40 is coupled with the first option switch 20 and switches the connection pin T1 to connect between the binding post S1 and the binding post S2 of the first option switch 20. The control module 40 is coupled with the second option switch 30 and also switches the connection pin S2 to connect between the binding post S3 and binding post S4 of the second option switch 30. Further, the control module 40 is coupled with the multimeter 10 and can read values of the multimeter 10 and switch different functions of the multimeter 10.

The adjusting power source 50 has a positive pole and a negative pole. The positive pole of the adjusting power source 50 is coupled with the binding post S4 of the second option switch 30. The negative pole of the adjusting power source 50 is coupled with the binding post S2 of the first option switch 20 and couples with ground meanwhile.

The button 60 is coupled with the first option switch 20 and the second option switch 30. The button 60 switches the connection pin T1 to connect between the binding post S1 and the binding post S2 of the first option switch 20. The button 60 switches the connection pin T2 to connect between the binding post S3 and the binding post S4 of the second option switch 30.

While the button 60 is turned on, the connection pin T1 is switched to couple with the binding post S1 of the first option switch 20, the connection pin T2 is switched to couple with the binding post S3 of the second option switch 30. In this case, the voltmeter 100 of the present disclosure is only equivalent to a function of the multimeter 10.

While the button 60 is turned off, the control module 40 switches the connection pin T1 to couple with the binding post S1 of the first option switch 20, and switches the connection pin T2 to couples with the binding post S4. The control module 40 also switches a voltage function of the multimeter 10 is turned on. In this case, the voltmeter 100 of the present disclosure is a high precision voltage meter.

Figure 2:
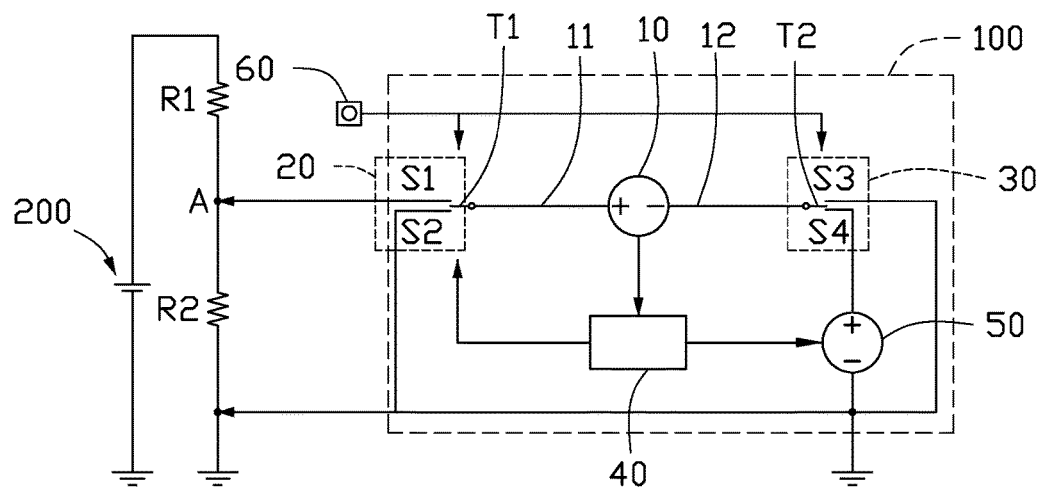
FIG. 2 is a diagram of the voltmeter coupled with a circuit of the present disclosure.

As illustrated in FIG. 2, the voltmeter 100 of the present disclosure described as a high precision voltage meter is coupled with a circuit. The circuit includes a power 200, a first resistance R1, a second resistance R2 coupled with the first resistance R1 in series and the voltmeter 100. The binding post S1 of the first option switch 20 is coupled with a test point A of the circuit, the binding post S3 of the second option switch 30 is coupled with ground. A method of using the voltmeter 100 for testing the test point A of the circuit is described as following:

First step: the control module 40 switches the connection pin T1 to couple with the binding post S1 of the first option switch 20, switches the connection pin T2 to couple with the binding post S4 of the second option switch 30. Thus, the positive probe 11 of the multimeter 10 is coupled with the testing point A of the circuit, the negative probe 12 of the multimeter 20 is coupled with the adjusting power source 50.

Second step: the control module 40 reads the voltage value of the multimeter 10, and then, manually adjusting the adjusting power source 50 to make the multimeter 10 become zero.

Third step: the control module 40 switches the connection pin T1 to couple with the binding post S2 of the first option switch 20, and keeps the connection pin T2 to couple with the binding post S4 of the second option switch 30, thus, positive probe 11 of the multimeter 10 is coupled with the negative pole of the adjusting power source 50 or ground, the negative probe 12 of the multimeter 10 is coupled with the positive pole of the adjusting power source 50, thus, a voltage value of the multimeter 10 is equal to a voltage value of the testing point A.

In the exemplary embodiment, a voltage value of the power 200 is 1.9V, R1=200 KΩ, R2=200KΩ, a theory voltage value of the testing point A is 950 mv. Further, while testing the testing point A using above method of the voltmeter 100, the actual voltage value of the testing point A is 951 mv. It can be seen clearly that the actual voltage value of the testing point A is quite close to the theory voltage of the testing point A.

In the present disclosure, the voltmeter 100 is equivalent a voltage value of the testing A to the adjusting power source 50, and then reads a voltage value of the adjusting power source 50. So the voltmeter 100 can prevent from splitting the voltage value of the circuit and improve the measurement accuracy.

The embodiments shown and described above are only examples. Many details are often found in the art such as the other features of a voltmeter and method for using the voltmeter. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A voltmeter, comprising:
   a multimeter having a positive probe and a negative probe;
   a first option switch having two binding posts S1, S2, and a connection pin T1;
   a second option switch also having two binding posts S3, S4 and a connection pin T2;
   a control module coupled with the first option switch and the second option switch and the multimeter; and
   an adjusting power source having a positive pole and a negative pole;
   wherein the positive probe of the multimeter is coupled with the connection pin T1 of the first option switch, the negative probe of the multimeter is coupled with the connection pin T2 of the second option switch; and
   wherein the control module controls the first option switch and the second option switch, and reads a value of the multimeter, the multimeter tests a voltage of a circuit by the adjusting power source being equivalent to the voltage of the circuit.

2. The voltmeter of claim 1, wherein the voltmeter further comprises a button coupled with the first option switch and the second option switch.

3. The voltmeter of claim 2, wherein the button switches the connection pin T1 of the first option switch to connect between the binding post S1 and the binding post S2 of the first option switch.

4. The voltmeter of claim 3, wherein the button switches the connection pin T2 of the second option switch to connect between the binding post S3 and the binding post S4 of the second option switch.

5. The voltmeter of claim 4, wherein while the button is turned on, the connection pin T1 is switched to couple with the binding post S1 of the first option switch, the connection pin T2 is switched to couple with the binding post S3 of the second option switch, the voltmeter is equivalent to a function of the multimeter.

6. The voltmeter of claim 4, wherein while the button is turned off, the control module switches the connection pin T1 to couple with the binding post S1 of the first option switch, and switches the connection pin T2 to couple with the binding post S4 of the second option switch, the control module also switches a voltage function of the multimeter, the voltmeter is a high precision voltage meter.

7. The voltmeter of claim 2, wherein the control module switches the connection pin T1 to connect between the binding post S1 and the binding post S2 of the first option switch.

8. The voltmeter of claim 7, wherein the control module switches the connection pin T2 to connect between the binding post S3 and binding post S4 of the second option switch.

9. The voltmeter of claim 2, wherein the control module reads the value of the multimeter and switches different functions of the multimeter.

10. The voltmeter of claim 2, wherein the positive pole of the adjusting power source is coupled with the binding post S4 of the second option switch, the negative pole of the adjusting power source is coupled with the binding post S2 of the first option switch.

11. A using method of the voltmeter of claim 1 comprising the following steps:
   the control module switches the connection pin T1 to couple with the binding post S1 of the first option switch, switches the connection pin T2 to couple with the binding post S4 of the second option switch, thus, the positive probe of the multimeter is coupled with a testing point A of the circuit, the negative probe of the multimeter is coupled with the adjusting power source;
   the control module reads the voltage value of the multimeter, and then, manually adjusting the adjusting power source to make the multimeter become zero;
   the control module switches the connection pin T1 to couple with the binding post S2 of the first option switch, and keeps the connection pin T2 to couple with the binding post S4 of the second option switch, thus, positive probe of the multimeter is coupled with the negative pole of the adjusting power source or ground, the negative probe of the multimeter is coupled with the positive pole of the adjusting power source, thus, a voltage value of the multimeter is equal to a voltage value of the testing point A.

* * * * *